United States Patent [19]

Mizutani

[11] Patent Number: 4,849,936
[45] Date of Patent: Jul. 18, 1989

[54] ACCESS CONTROL DEVICE AND METHOD FOR DYNAMIC MEMORY DEVICES

[75] Inventor: Motoharu Mizutani, Tokyo, Japan

[73] Assignee: Kabushiki Kaisha Toshiba, Kawasaki, Japan

[21] Appl. No.: 878,244

[22] Filed: Jun. 25, 1986

[30] Foreign Application Priority Data

Jun. 26, 1985 [JP] Japan .................................. 60-139501

[51] Int. Cl.⁴ .............................................. G11C 7/00
[52] U.S. Cl. ............................. 365/189.01; 365/195; 365/222
[58] Field of Search ............... 365/222, 189, 195, 230, 365/233

[56] References Cited

U.S. PATENT DOCUMENTS

| 4,293,926 | 10/1981 | Amano | 364/900 |
| 4,376,988 | 3/1983 | Ludwig et al. | 365/222 |
| 4,575,826 | 3/1986 | Dean | 365/222 |
| 4,636,989 | 1/1987 | Ikuzaki | 365/222 |

FOREIGN PATENT DOCUMENTS 2619238 4/1976 Fed. Rep. of Germany .

Primary Examiner—Stuart N. Hecker
Assistant Examiner—Alyssa H. Bowler
Attorney, Agent, or Firm—Finnegan, Henderson, Farabow, Garrett, & Dunner

[57] ABSTRACT

In a dynamic memory device, the content thereof being periodically refreshed, for the purpose of giving a priority to an external access signal, a timer of a given timer time is started by the external access request signal after termination of an access operation. When a refresh request and a access request occurs in the timer time, acceptance of the refresh request is delayed and the priority is given to the access request signal.

4 Claims, 3 Drawing Sheets

ACCESS CONTROL DEVICE AND METHOD FOR DYNAMIC MEMORY DEVICES

BACKGROUND OF THE INVENTION

1. Field of the Invention

This invention relates to an access control device and a method for a dynamic memory device requiring periodic refreshing of the memory content, and more particularly, a method and a device capable of accessing at a definite period irrespective of the refreshing operation.

2. Description of the Prior Art

As is well known in the art, in case of, for example, 256 K-bit DRAM, a dynamic memory device is required to refresh at a period of about 4 milliseconds for the purpose of holding the memory content. During an interval in which the refreshing is made it is impossible to access from outside. Accordingly, when an external access request is made during the refreshing interval, it is necessary to cause the access request to wait until the refreshing is completed.

Consequently, in a prior art circuit for controlling access of a dynamic memory device where a refresh request and an external access request occur simultaneously, a priority is given to the refresh request, whereas when these requests do not occur simultaneously, the refresh request and the access request are accepted according to their received order so as to permit an access corresponding to a given access request.

However, when a refresh request and an external access request occur simultaneously by merely giving the priority to the refresh request, where there is a device periodically producing access requests, for example, where a typewriter is connected, the printing device must be designed by taking into consideration the refresh period which delays the printing speed.

SUMMARY OF THE INVENTION

Accordingly, it is an object of this invention to provide a novel method and device for controlling access of a dynamic memory device which prevents as far as possible a decrease in the access speed caused by refreshing. Especially where an access request is made at a definite period, this method enables a high speed access request.

According to one aspect of this invention, there is provided an access control device of dynamic memory means comprising timer means started in synchronism with an external access request signal, and means for inhibiting a refresh operation in a timer time of the timer means so as to give a priority to the external access request signal, the means for accepting a refresh request signal and the external access signal in an order of their arrival when the timer time is over.

According to another aspect of this invention, there is provided a method of access control of dynamic memory means comprising the steps of detecting whether there is a new access request or not in a predetermined timer time, detecting whether there is a refresh request or not in the timer time, where there are the refresh request and the access request in the timer time, rejecting acceptance of the refresh request and accepting the access request, and, where acceptance of the refresh request is rejected in a case in which there are the refresh request and the access request in the timer time, accepting the refresh request immediately after execution of the access operation according to the access request.

DESCRIPTION OF THE PREFERRED EMBODIMENT

Figure 1:
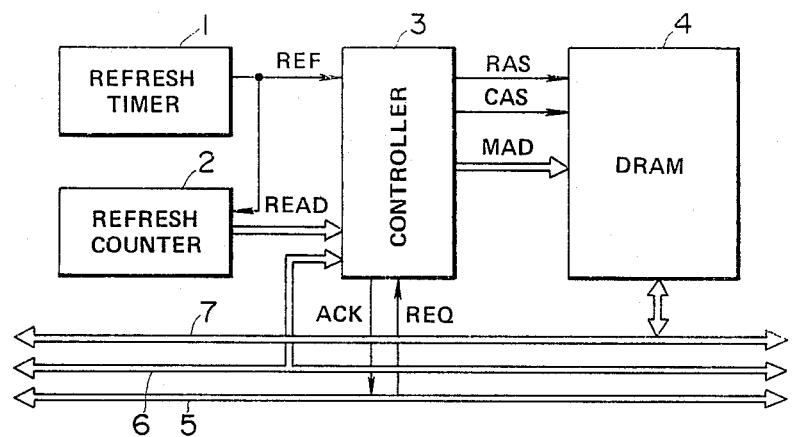
FIG. 1 is a block diagram showing one embodiment of this invention.

FIG. 1 is a block diagram showing a preferred embodiment of this invention which comprises a refresh timer 1, a refresh counter 2, a controller 3, and a dynamic memory device (DRAM) 4. The refresh timer 1 generates a refresh request signal REF at a predetermined period for supplying the refresh request signal to refresh counter 2 and a controller 3. The refresh counter 2 generates a refresh address signal RFAD for advancing refresh addresses of DRAM in a row unit. Each time the refresh address signal RFAD is incremented by one row and the incremented signal is supplied to the controller 3.

The controller 3 is supplied with an access request signal REQ given from a control bus line 5 and to be supplied to DRAM 4, and the refresh request signal REF. When the refresh request signal REF is applied, the controller 3 selects a refresh address signal RFAD given from the refresh counter 2 to output the selected refresh address signal as a memory address signal MAD for DRAM 4. Further, the controller 3 outputs a row address strobe signal RAS for refreshing memory content of a row address designated by signal RFAD. When supplied with an access request signal REQ, among address signals sent out to an address bus line 6, upper order bit signals are selected as a low address signal and lower order bit signals are selected as a column address signal. These selected signals are supplied to DRAM 4, on a time division basis, to act as a memory address signal. Also, the controller 3 sends out a signal RAS in synchronism with the sending out timing of the row address signal and a column address strobes signal in synchronism with the sending out timing of the column address signal, thereby writing or reading data in a specific address to which an access request is made. At this time, written data and read out data are exchanged through a data bus line 7. At the time of completion of the write or read operation, a confirmation signal ACK confirmng the completion is outputted from the controller 3.

Figure 2:
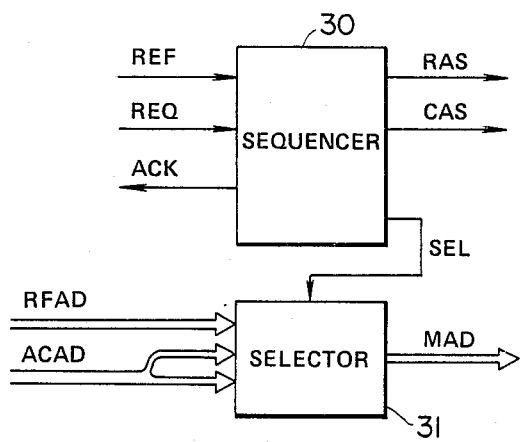
FIG. 2 is a block diagram showing the detail of the construction of the controller shown in FIG. 1.

FIG. 2 shows the detailed construction of the controller 3 constituted by a sequencer 30 and a selector 31.

At the time of receiving a refresh request signal REF or an access request signal REQ, the sequencer 30 outputs signals RAS, CAS and ACK described above. In addition, at the time of receiving a signal REF, the sequencer selects a refresh address signal RFAD as a memory address signal MAD, whereas upon receipt of a signal REQ, the selector 31 outputs a select signal SE 1 for selecting upper order bits or lower order bits of the address signal ACAD sent out to the address bus line 6. In response to the select signal thus outputted, the selector 31 selects either one of the upper order bits or the lower order bits of signals RFAD and ACAD and the selected bits are outputted as a memory address signal MAD.

Figure 3:
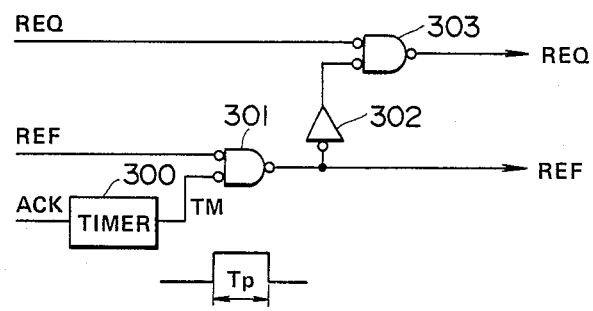
FIG. 3 is a block diagram showing one example of the priority circuit in the sequencer shown in FIG. 2.

FIG. 3 shows one example of a priority control circuit contained in the sequencer 30, which gives priority to one of either the refresh request signal or the access request signal occurring simultaneously. The priority control circuit includes a timer 300 started by signal ACK. When a refresh request signal REF is received in the timer time $T_p$ of the timer 300, signal REF is blocked by a negative logic AND gate circuit 301 according to the output signal (high or "H" signal) of the timer 300. More particularly, when an access to DRAM 4 caused by an access request signal REQ is completed, even when a refresh request signal REF is received in the set time $T_p$ of the timer 300, the signal REF is blocked by the AND gate circuit 301, thus delaying the refresh operation of DRAM 4. However, when the signal REF is received after elapse of the set time of the timer 300, since the output signal TM of timer 300 is low ("L"), signal REF passes through the AND gate circuit 301, thus executing the refresh operation.

As the refresh request signal passes through the AND gate circuit 301, the signal REF is inverted by an inverter 302 and then applied to one input terminal of a negative logic AND gate circuit 303, the other input terminal thereof being supplied with an access request signal REQ. Thus, until the refresh operation terminates, signal REQ cannot pass through AND gate circuit 303 so that an external access request is made to wait.

More particularly, in a high speed access operation in which a new access request signal REQ is inputted during the set time of timer 300, the refresh operation is inhibited while the timer output signal TM is "H", whereby the refresh operation is delayed until the timer output signal returns to "L", that is, until an access operation according to a new access request signal received in the set time of the timer 300 terminates. However, if the timer output signal TM is "L", by the logic operations of AND gate circuits 301 and 303, earlier one of signals REQ and REF will be received first.

Figure 4:
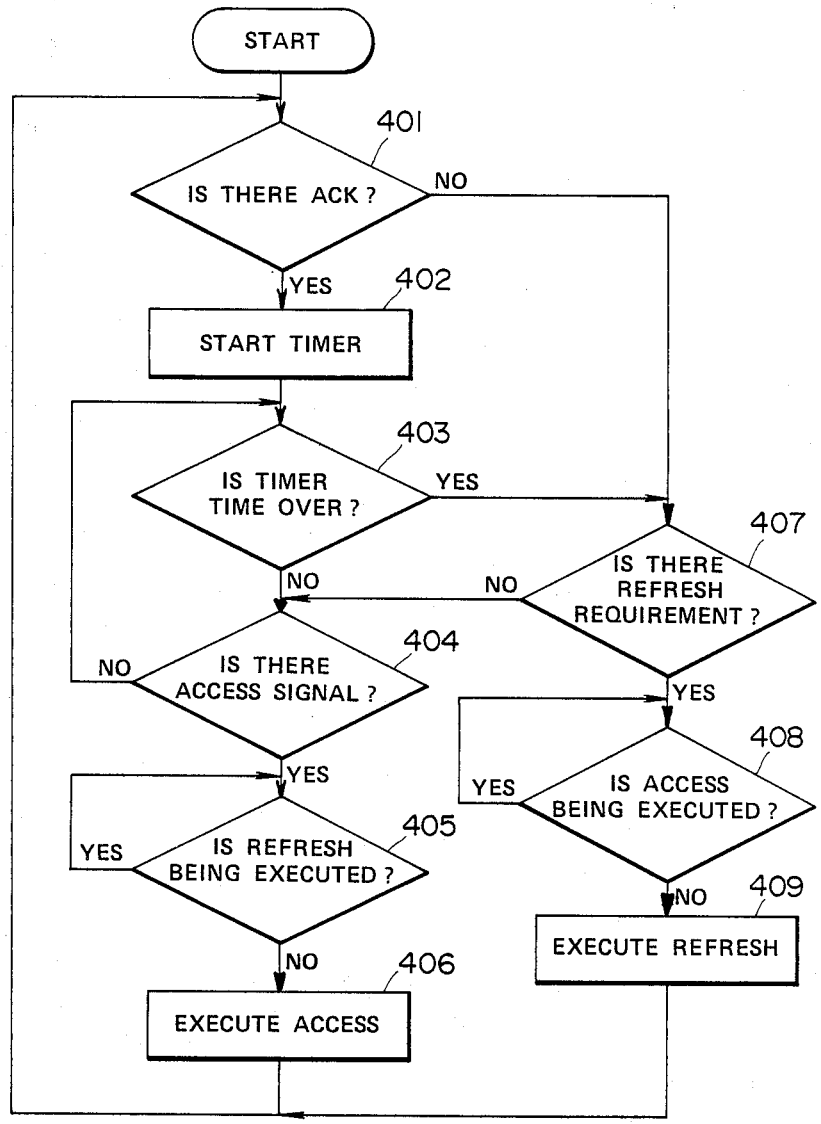
FIG. 4 is a flow chart showing the operation of the priority circuit in the sequence shown in FIG. 2, and FIG. 5a and 5b are timing charts useful to explain the operations of a prior art device and the embodiment shown in FIG. 1.

It should be understood that FIG. 3 shows only the performance of the priority control circuit in the sequencer 30 and the operation of this control circuit is shown by a flow chart shown in FIG. 4.

In FIG. 4, at step 401, a judgment is made as to whether a signal ACK has been produced or not. When the result of this judgment is YES, at step 402, the timer 300 shown in FIG. 3 is started. Then at step 403, a judgment is made as to whether the timer time is over or not. If the result is No, that is, the timer time is not elapsed, at step 404, a judgment is made as to whether there is an access request or not. When the result of judgment is YES, at step 405, a judgment is made as to whether a refresh operation is being executed or not. If the result of judgment is No, at step 406, an access operation is executed. When the result of judgment at step 405 is YES, the program is returned to step 405. At step 406, the sequencer 30 outputs signals RAS and CAS at predetermining timings for executing an access operation.

When the result of judgment at step 404 is No, the program is returned to step 403 to judge again whether the timer time is over. This operation is repeated until the timer time is over. At this time, no judgment is made as to whether there is a refresh request or not. In other words, even when there is a refresh request REF during the timer time, this is neglected.

When the result of judgment at step 403 is YES, or the result of judgment at step 401 is No, the program is branched to step 407 at which a judgment is made as to whether there is a refresh request REF or not. When the result of judgment at step 407 is YES, at step 408, a judgment is made as to whether an access is being made or not. When the result of judgment is No, at step 409, a refresh operation is executed. (The sequencer 30 outputs a signal RAS at predetermined timings for executing refresh operation.) For example, when there is a refresh request REF during the timer time, at step 407 it is judged that there occurs a refresh request after the timer time is over, whereas when the refresh request occurs during the access operation, the refresh operation is executed immediately after completion of the access operation. When the result of judgment at step 407 is No, the program is transferred to step 404 at which a judgment is made as to whether there is an access request REQ. When the result of judgment at step 404 is YES, an access operation is executed at step 406 following step 405. Thus, when the timer time is over, the refresh request REF and the access request are accepted in the order of arrival, thus sequentially executing the refresh operation and the access operation.

Figure 5A:
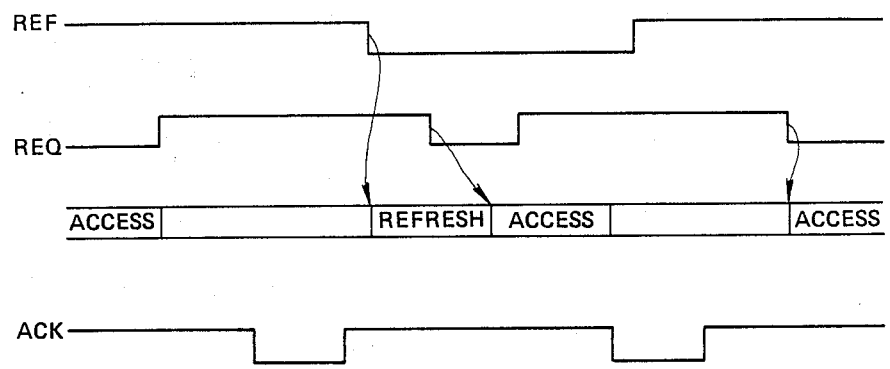
Figure 5B:
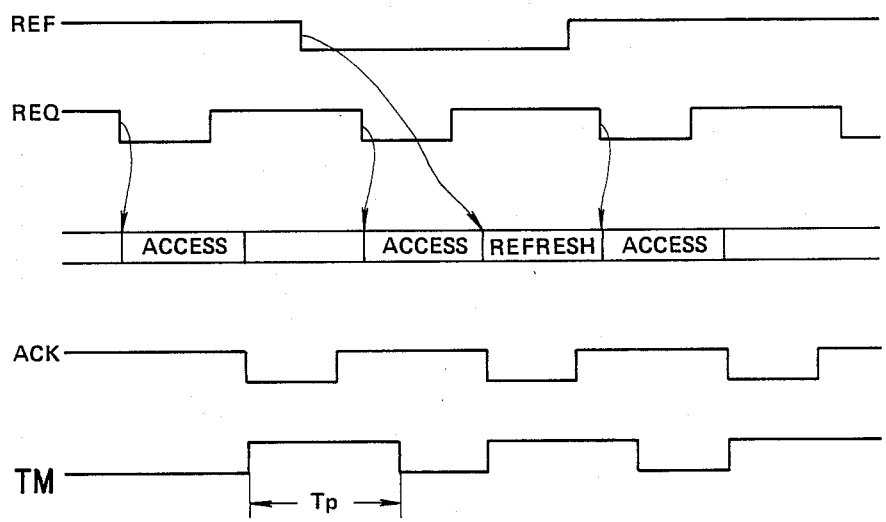

FIG. 5a is a timing chart showing the operation of the prior art apparatus in a high speed access state in which there is an access request at a definite period, and FIG. 5b shows a timing chart showing the operation of the apparatus of this invention.

As can be noted from FIG. 5a, the prior art apparatus is constructed to accept an access request and a refresh request according to their order of arrival. Consequently, while a refresh operation is being executed in accordance with a refresh request signal generated at the build down time of a refresh request signal REF, the access request signal builds down to produce an access request signal. In this case, an access based on the access request operation is executed after completion of the refresh operation. For this reason, in the prior art apparatus, it is necessary to set a constant permissible maximum period by taking into consideration the time required for the refresh operation.

In contrast, according to the apparatus of this embodiment, as shown in FIG. 5b, during a definite interval after build down of signal ACK, that is, during the timer time $T_p$ of timer 300, the refresh operation is inhibited so as to give the priority to the access request and a refresh operation of the refresh request produced in the timer time $T_p$ will be executed after completion of the access operation caused by the access request. For this reason, it is possible to set shorter permissible maximum period than the prior art apparatus thereby increasing the speed of the access request. In this case, the shortest period of the access request signal is set to be equal to or longer than the sum of the access operation time and the refresh operation time.

Although in this embodiment, the timer 300 is started after termination of reading or writing data into DRAM 4 or by a signal ACK, it can be started at the time of receiving an access request signal REQ.

What is claimed is:

1. An access control device for a dynamic memory, said access control device receiving periodic requests for access to addresses in the dynamic memory and comprising:

first timer means for generating a refresh request;

refresh address designation means for designating an address to be refreshed in the dynamic memory, responsive to said refresh request generated by said first timer means;

refresh means for performing a refresh operation to refresh the contents of said dynamic memory at said address designated by said refresh address designation means;

access means for performing a memory access operation to access an address in response to each of a plurality of access requests;

second timer means responsive to the completion of a memory access operation for performing a timer operation and for maintaining the timer operation for a predetermined time period longer that the time period between the completion of an access operation and receipt of a next access request; and inhibition means responsive to said timer operation of said second timer means for inhibiting a refresh request generated during said predetermined time period;

wherein when a refresh request and an access request are generated during the predetermined time period, said access operation is performed first in response to an access request and said refresh operation is performed second in response to said refresh request immediately after the completion of said access operation.

2. An access control device for a dynamic memory, said access control device receiving periodic requests for access to addresses in the dynamic memory and comprising:

first timer means for generating a refresh request;

refresh address designation means for designating an address to be refreshed in the dynamic memory, responsive to said refresh request generated by said first timer means;

refresh means for performing a refresh operation to refresh the contents of said dynamic memory at said address designated by said refresh address designation means;

access means for performing a memory access operation to access an address in response to each of a plurality of access requests wherein the time period between said access requests is at least equal to the sum of the time periods required for performance of the access operation and for performance of the refresh operation;

second timer means responsive to the completion of a memory access operation for performing a timer operation and for maintaining the timer operation for a predetermined time period; and inhibition means responsive to said timer operation of said second timer means for inhibiting a refresh request generated during said predetermined time period;

wherein when a refresh request and an access request are generated during the predetermined time period, said access operation is performed first in response to an access request and said refresh operation is performed second in response to said refresh request immediately after the completion of said access operation.

3. A method for controlling access of a dynamic memory, comprising the steps of:

generating a periodically occurring refresh request;

performing a refresh operation on the dynamic memory in response to said periodically occurring refresh request;

performing a plurality of access operations including a last and a next access operation on the dynamic memory, each access operation performed in response to an access request occurring asychronously with respect to said refresh request;

inhibiting said refresh request for a predetermined time period longer than the time period between completion of said last access operation and occurrence of said next access request after completion of said access operation to give priority to a next access request; and postponing said refresh operation until after completion of said next access operation when said refresh request and said next access request occur within said predetermined time period, regardless of the order of said refresh request and said next access request.

4. A method for controlling access of a dynamic memory, comprising the steps of:

generating a periodically occurring refresh request;

performing a refresh operation on the dynamic memory in response to said periodically occurring refresh request;

performing a plurality of access operations including a last and a next access operation on the dynamic memory, each access operation performed in response to an access request occurring asychronously with respect to said refresh request, and wherein the time period between said access requests is at least equal to the sum of the time periods required to perform one of said access operations and to perform one of said refresh operations;

inhibiting said refresh request for a predetermined time period after completion of said last access operation to give priority to a next access request; and postponing said refresh operation until after completion of said next access operation when said refresh request and said next access request occur within said predetermined time period, regardless of the order of said refresh request and said next access request.

* * * * *